United States Patent
Chehade et al.

(10) Patent No.: US 12,484,190 B2
(45) Date of Patent: Nov. 25, 2025

(54) HERMETIC SEALED ELECTRONIC ASSEMBLY FOR NON DIELECTRIC IMMERSION COOLING SYSTEM

(71) Applicant: OVH, Roubaix (FR)

(72) Inventors: Ali Chehade, Moncheaux (FR); Mohamad Hnayno, Roubaix (FR)

(73) Assignee: OVH, Roubaix (FR)

( * ) Notice: Subject to any disclaimer, the term of this patent is extended or adjusted under 35 U.S.C. 154(b) by 283 days.

(21) Appl. No.: 18/236,509

(22) Filed: Aug. 22, 2023

(65) Prior Publication Data

US 2024/0074108 A1 Feb. 29, 2024

(30) Foreign Application Priority Data

Aug. 29, 2022 (EP) .................................... 22306275

(51) Int. Cl.
H05K 7/20 (2006.01)
(52) U.S. Cl.
CPC ......... H05K 7/203 (2013.01); H05K 7/20327 (2013.01); H05K 7/20809 (2013.01)
(58) Field of Classification Search
CPC ............... H05K 7/203; H05K 7/20327; H05K 7/20809; H05K 7/20236; H05K 1/0203; H05K 7/20936; H05K 7/20663; H05K 7/208; H05K 7/20263; H05K 7/20763; H05K 7/20836; H01L 23/44; H01L 23/473; H01L 23/3107; G06F 2200/201; G06F 1/20; G06F 1/206; F28D 1/0206
USPC ...................................................... 361/679.53
See application file for complete search history.

(56) References Cited

U.S. PATENT DOCUMENTS

| | | | |
|---|---|---|---|
| 2017/0265336 A1* | 9/2017 | Ichinose | H05K 7/20772 |
| 2018/0092243 A1* | 3/2018 | Saito | H01L 23/473 |
| 2019/0223324 A1* | 7/2019 | Le | H05K 7/20263 |
| 2022/0322575 A1* | 10/2022 | Hnayno | H05K 7/20772 |
| 2023/0059446 A1* | 2/2023 | Gao | H05K 7/208 |
| 2024/0260228 A1* | 8/2024 | Chuang | H05K 7/20236 |

OTHER PUBLICATIONS

European Search Report with regard to the EP Patent Application No. 22306275.3 completed Feb. 17, 2023.

* cited by examiner

*Primary Examiner* — Mandeep S Buttar
*Assistant Examiner* — Kyle Oxenknecht
(74) *Attorney, Agent, or Firm* — BCF LLP (57) ABSTRACT

The disclosed systems, structures, and methods are directed to providing a rack-mounted fluid immersion cooling (IC) configuration. The rack-mounted fluid IC configuration comprises a rack-mounted immersion reservoir containing a volume of thermally cooled non-dielectric fluid and at least one electronic processing assembly comprising one or more electronic processing components. The at least one electronic processing assembly being encased within a hermetic sealed bag configured to provide a water- and air-tight seal of the at least one electronic processing assembly to shield against the direct exposure of the electronic processing components to fluids. The at least one hermetic sealed electronic processing assembly is submerged within the volume of thermally cooled fluid contained by the rack-mounted immersion reservoir.

13 Claims, 5 Drawing Sheets

HERMETIC SEALED ELECTRONIC ASSEMBLY FOR NON DIELECTRIC IMMERSION COOLING SYSTEM

CROSS REFERENCE

The present application claims priority to EP Application No. 22306275.3, filed Aug. 29, 2022 entitled "Hermetic Sealed Electronic Assembly for Non Dielectric Immersion Cooling System", the entirety of which is incorporated herein by reference.

FIELD

The present disclosure generally relates to the cooling of rack-mounted electronic equipment and, in particular, to fluid immersion cooling systems of such equipment.

BACKGROUND

Electronic equipment such as, for example, processing servers, memory storage systems, etc. are typically arranged in equipment racks. Large computing facilities servicing the increased demand for processing resources may contain thousands of racks to support such electronic equipment.

Such electronic equipment racks, including support equipment mounted on their backplanes, consume large amounts of electric power for proper operations which, in turn, results in the generation of substantial amounts of heat. For example, certain components of electronic assemblies, such as, processing units, generate so much heat during operations that they are susceptible to failure within seconds without consistent adequate cooling. Accordingly, cooling measures/techniques are of particular import to electronic equipment racks.

In conventional implementations, fans are mounted within the electronic equipment racks to provide forced-air cooling to the rack-mounted equipment housing electronic assemblies. However, while these measures ventilate away the heat generated within the rack-mounted equipment they also displace the heat onto the general ambient environment which, in turn, requires further ambient cooling measures.

Recently, liquid cooling methods have been introduced as an addition and/or alternative to conventional fan forced-air cooling of electronic equipment racks. One such method incorporates immersion cooling (IC) techniques, in which electronic components are fully submerged within a rack-mounted IC reservoir containing a non-conductive cooling liquid, such as, for example, oil-based dielectric cooling liquids. These IC techniques employ pumps, heat sink structures, heat exchangers, etc. to circulate the dielectric cooling liquid within the IC reservoir, to maintain thermal contact between the heat generating electronic components and the dielectric cooling liquid, and to ensure that the cooling liquid is maintained at a lower temperature level sufficient to cool the heat generating electronic components.

However, there are certain drawbacks to the use of dielectric cooling liquids in IC reservoirs for cooling heat generating electronic components. In particular, dielectric fluids are viscous exhibiting less than optimal heat transfer efficiencies and, after extended periods of exposure, the chemical properties of dielectric fluids directly contribute to the corrosion and breakdown of electrical contacts and electronic components. Furthermore, dielectric fluids are expensive to maintain for large scale datacenters, as they have limited efficacy life cycles and require complete replacement every 5-10 years.

Given the noted drawbacks of the IC dielectric cooling measures, improvements are still desirable in achieving the overall cooling performance of rack-mounted liquid-cooled electronic assemblies.

The subject matter discussed in the background section should not be assumed to be prior art merely as a result of its mention in the background section. Similarly, a problem mentioned in the background section or associated with the subject matter of the background section should not be assumed to have been previously recognized in the prior art.

SUMMARY

The embodiments and examples of the present disclosure are provided based on developers' understanding of the drawbacks associated with conventional dielectric fluid immersive cooling systems for cooling electronic assemblies containing heat-generating components.

In addressing such drawbacks, the examples of the present technology provide a rack-mounted fluid immersion cooling (IC) system that comprises a rack-mounted immersion reservoir containing a volume of thermally cooled fluid; and at least one electronic processing assembly comprising one or more electronic processing components, the at least one electronic processing assembly being encased within a hermetic sealed bag configured to provide a water- and air-tight seal of the at least one electronic processing assembly and shield against direct fluid exposure by the corresponding one or more electronic processing components, wherein the at least one hermetic sealed electronic processing assembly is submerged within the volume of thermally cooled fluid contained by the rack-mounted immersion reservoir.

In various examples, the thermally cooled fluid is a non-dielectric fluid.

In various examples, the hermetic sealed bag is a hermetic vacuum-sealed bag that is vacuum-sealed to encase the at least one electronic processing assembly.

The rack-mounted fluid IC system further comprises that the hermetic sealed bag embodies a film material formed by a polyamide compound or a polyethylene compound and is configured to provide a water- and air-tight seal sealing of and around power, communication cabling facilities, and cooling water distribution channels servicing the electronic processing components.

The rack-mounted fluid IC system also provides that the non-dielectric fluid comprises water.

In various examples, the rack-mounted fluid IC system provides that the sealed bag internally incorporates one or more thermally-conductive fin structures as well as incorporate a heat managing substance (e.g. a phase-changing material, PCM) that may be coupled to the fin structures.

In various examples, the sealed bag is configured to maximize direct tactile contact between surfaces of the sealed bag and surfaces of the electronic processing components.

In various examples, the sealed bag is configured to provide a liquid- and air-tight seal sealing of the at least one hermetic sealed electronic assembly package and around power and communication cabling facilities and liquid cooling distribution facilities that service the electronic processing components.

In various examples, the sealed bag comprises a film material formed by a material selected from a group of materials, said group comprising: polyamide compounds, polyethylene compounds and combinations thereof.

In various examples, wherein the sealed bag comprises a film material manifesting low thermal resistance properties while having heat protective properties capable of withstanding temperatures exceeding 120° C.

In various examples, the thermally cooled non-dielectric fluid comprises water.

In various examples, the sealed bag internally incorporates one or more thermally-conductive fin structures configured to enhance heat transfer from the hermetic sealed electronic assembly package to the thermally cooled non-dielectric fluid.

In various examples, the thermally-conductive fin structures incorporate phase changing materials (PCMs) capable of changing physical states depending on temperature fluctuations.

In various examples, the rack-mounted, fluid IC system further comprises a first cooling loop configured to circulate a first heat transfer fluid, the first cooling loop comprising the rack-mounted immersion reservoir containing the submerged hermetic sealed electronic processing package, a first pump configured to forcibly supply the first heat transfer fluid in the first cooling loop; and a first side of a liquid-to-liquid heat exchanger, the first side being fluidly connected to the rack-mounted immersion reservoir. The rack-mounted, fluid IC system further comprises a second cooling loop configured to circulate a second heat transfer fluid, the second cooling loop comprising a fluid facility for providing a cold second heat transfer fluid, a second side of the liquid-to-liquid heat exchanger, the second side being thermally coupled to the first side for transfer of heat from the first side to the second side when a temperature of the first side is higher than a temperature of the second side and a second pump configured to forcibly supply the second heat transfer fluid to the rack-mounted immersion reservoir.

In various examples, the liquid-to-liquid heat exchanger comprises a plate heat exchanger (PHEX).

In various examples, the rack-mounted fluid IC system further comprises a serpentine convection coil submerged within the non-dielectric fluid contained by the rack-mounted IC reservoir, the serpentine convection coil structured with multiple hollow-channel coils to internally channel a heat-transfer fluid; at least one liquid cooling block encased within the hermetic sealed electronic assembly package, the at least one liquid cooling block including an internal conduit structure for internally channeling the heat-transfer fluid therethrough, the internal conduit structure of the at least one liquid cooling block being fluidly connected to the serpentine convection coil, the heat-transfer fluid collecting thermal energy from the one or more electronic processing components upon flowing in the internal conduit structure; and a return warm fluid distribution circuit configured to return warm heat-transfer fluid, caused by the heat-generating electronic components, back to the external fluid facility.

In various examples, the at least one liquid cooling block is arranged to be in direct thermal contact with the one or more electronic processing components of the submerged hermetic sealed electronic processing assembly.

In various examples, the at least one liquid cooling block comprises a plurality of liquid cooling blocks configured in a serial fluid communication arrangement to facilitate the successive transfer of channeled heat-transfer fluid.

Moreover, the embodiments and examples of the present disclosure also provide a method for non-dielectric fluid immersion cooling (IC) of at least one rack-mounted electronic assembly containing one or more electronic processing components. The method comprising providing a volume of thermally cooled non-dielectric fluid to a rack-mounted immersion reservoir and encasing the rack-mounted electronic assembly within a hermetic sealed bag that provides a water- and air-tight seal to protect against direct fluid exposure by the one or more electronic processing components. The method also comprising that the encased hermetic sealed electronic processing assembly is submerged within the volume of thermally cooled non-dielectric fluid contained by the rack-mounted immersion reservoir. The method further comprising that the fluid comprises water.

In the context of the present specification, unless expressly provided otherwise, a computer system may refer, but is not limited to, an "electronic device", an "operation system", a "system", a "computer-based system", a "controller unit", a "monitoring device", a "control device" and/or any combination thereof appropriate to the relevant task at hand.

In the context of the present specification, unless expressly provided otherwise, the expression "computer-readable medium" and "memory" are intended to include media of any nature and kind whatsoever, non-limiting examples of which include RAM, ROM, disks (CD-ROMs, DVDs, floppy disks, hard disk drives, etc.), USB keys, flash memory cards, solid state-drives, and tape drives. Still in the context of the present specification, "a" computer-readable medium and "the" computer-readable medium should not be construed as being the same computer-readable medium. To the contrary, and whenever appropriate, "a" computer-readable medium and "the" computer-readable medium may also be construed as a first computer-readable medium and a second computer-readable medium.

In the context of the present specification, unless expressly provided otherwise, the words "first", "second", "third", etc. have been used as adjectives only for the purpose of allowing for distinction between the nouns that they modify from one another, and not for the purpose of describing any particular relationship between those nouns.

Implementations of the present technology each have at least one of the above-mentioned object and/or aspects, but do not necessarily have all of them. It should be understood that some aspects of the present technology that have resulted from attempting to attain the above-mentioned object may not satisfy this object and/or may satisfy other objects not specifically recited herein.

Additional and/or alternative features, aspects and advantages of implementations of the present technology will become apparent from the following description, the accompanying drawings and the appended claims.

BRIEF DESCRIPTION OF THE FIGURES

Further features and advantages of the present disclosure will become apparent from the following detailed description, taken in combination with the appended drawings, in which.

DETAILED DESCRIPTION

The instant disclosure is directed to address at least some of the drawbacks of the current immersive cooling (IC) technologies. In particular, the instant disclosure presents a hermetic sealed solution for electronic assemblies submerged in water-based IC rack-mounted systems.

The examples and conditional language recited herein are principally intended to aid the reader in understanding the principles of the present technology and not to limit its scope to such specifically recited examples and conditions. It will be appreciated that those skilled in the art may devise various arrangements that, although not explicitly described or shown herein, nonetheless embody the principles of the present technology.

Furthermore, as an aid to understanding, the following description may describe relatively simplified implementations of the present technology. As persons skilled in the art would understand, various implementations of the present technology may be of a greater complexity.

In some cases, what are believed to be helpful examples of modifications to the present technology may also be set forth. This is done merely as an aid to understanding, and, again, not to define the scope or set forth the bounds of the present technology. These modifications are not an exhaustive list, and a person skilled in the art may make other modifications while nonetheless remaining within the scope of the present technology. Further, where no examples of modifications have been set forth, it should not be interpreted that no modifications are possible and/or that what is described is the sole manner of implementing that element of the present technology.

Moreover, all statements herein reciting principles, aspects, and implementations of the present technology, as well as specific examples thereof, are intended to encompass both structural and functional equivalents thereof, whether they are currently known or developed in the future. Thus, for example, it will be appreciated by those skilled in the art that any block diagrams herein represent conceptual views of illustrative systems embodying the principles of the present technology.

With these fundamentals in place, we will now consider some non-limiting examples to illustrate various implementations of aspects of the present disclosure.

As noted above, IC configurations employing dielectric cooling fluids exhibit certain drawbacks and limitations. That is, dielectric cooling fluids have the potential of being flammable, exhibit less than optimal heat transfer efficiency, contribute to the corrosion of electronic components after extended periods of exposure, and are expensive to maintain and replace due to their limited efficacy life cycles.

In view of these drawbacks, the instant disclosure is directed to a configuration that incorporates non-dielectric alternatives to the use of dielectric cooling fluids in rack-mounted IC systems. However, due to the potential for ionic conductivity and resulting incompatibility with electrical operations, electronic assemblies must be protected and isolated from direct exposure to the non-dielectric cooling fluids.

In one, nonlimiting example, the non-dielectric cooling fluid comprises water, as it manifests a low viscosity, is non-flammable, and has a high heat transfer/convection efficiency. Solely for the purposes of simplicity and tractability, the disclosures will refer to "water-based cooling," and "water-based IC system", with the understanding that such phrases are representative of one of many alternative non-dielectric cooling media and the phrases are not intended, in any way, to be limiting.

Figure 1:
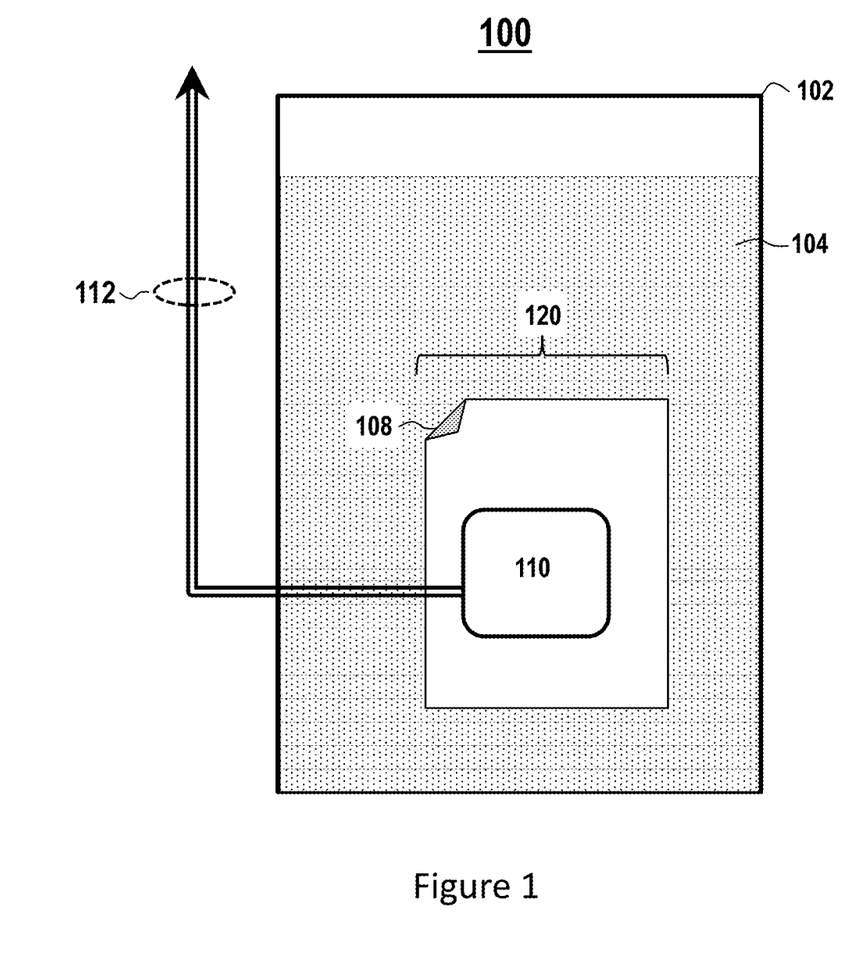
FIG. 1 depicts a conceptual diagram of a rack-mounted, fluid IC system, in accordance with examples of the present technology.

To this end, FIG. 1 depicts a conceptual diagram of a rack-mounted, non-dielectric fluid (i.e., water-based) IC system 100 for the cooling of electronic assemblies, in accordance with the examples of the present disclosure. As shown, water-based IC system 100 comprises a rack-mounted IC reservoir 102 containing thermally cooled fluid 104. In the examples set forth in the present disclosure, the thermally cooled fluid 104 is a non-dielectric fluid. However, the thermally cooled fluid 104 may be a dielectric fluid in some alternative examples. As described in greater detail below, in operation, the circulation of thermally cooled non-dielectric fluid 104 is supplied by facilities external to the rack-mounted IC reservoir 102. In the examples described in the present disclosure, the thermally cooled non-dielectric fluid 104 is water. The IC system 100 may include a sensor (e.g. a pressure sensor or an ultrasonic sensor) for determining a level of the non-dielectric fluid in the IC reservoir 102.

The non-dielectric fluid-based IC system 100 further comprises a hermetically sealed electronic assembly package 120 submerged within the cooled non-dielectric fluid 104 of IC reservoir 102. The electronic assembly package 120 typically includes electronic components 110 comprising heat generating electronic components, such as, central processing units (CPUs), graphics processing units (GPUs), neural processing units (NPUs), tensor processing units (TPUs), etc., as well as communication components, and storage components, such as, RAM, ROM, hard disk drives, etc.

The sealed electronic assembly package 120 is hermetically encased within hermetic sealed bag 108 (or other similar flexible containment structure), such that the associated electronic components 110, as well as the power and communication cabling facilities 112 coupled to and communicatively servicing the electronic components, are protected by the hermetic water- and air-tight sealed bag 108.

Figure 2:
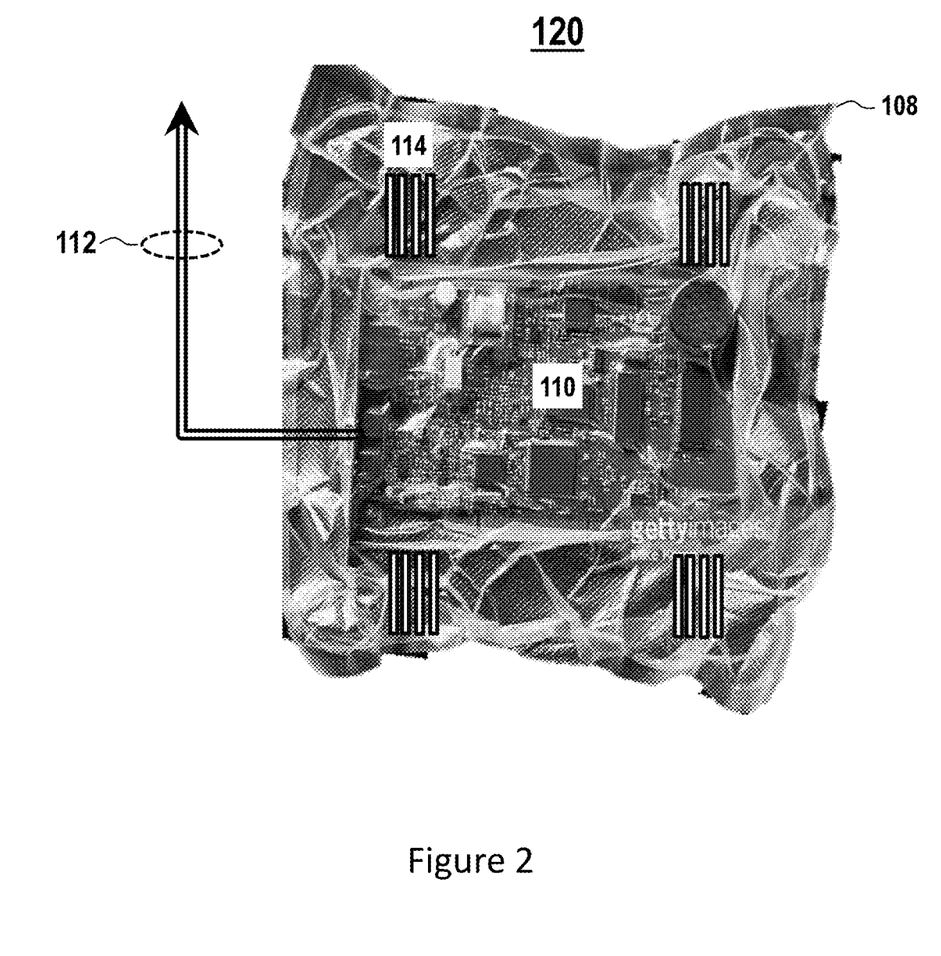
FIG. 2 depicts a hermetic sealed electronic assembly package, in accordance with examples of the present technology.

FIG. 2 depicts the hermetic sealed electronic assembly package 120 configured to hermetically encase the electronic components 110 submerged within the thermally cooled thermally cooled non-dielectric fluid 104 of the rack-mounted IC reservoir 102, in accordance with the examples of the present disclosure. As shown, hermetic sealed bag 108 provides an air- and water-tight sealing of the electronic components 110 such that the sealing results in maximal direct tactile contact between the film of the hermetic sealed bag 108 and the surfaces of the electronic components 110 with as a little air pockets or air buffers as possible to ensure the efficient thermal transfer of heat into the ambient cooled thermally cooled non-dielectric fluid 104 and shield against any exposure to fluids. The same maximal direct contact applies to the sealing of and around the power and communication cabling facilities 112 to ensure no fluid leaks into the sealed electronic assembly package 120.

In accordance with certain examples, the properties of the film material of hermetic sealed bag 108 may comprise polyamide and/or polyethylene compounds or any suitable compounds exhibiting waterproof feature, relatively high thermal conductivity as well as manifesting heat protective characteristics. For example and without limitation, said heat protective characteristics may enable the film material to withstand temperatures exceeding 120° C.

In accordance with various examples, the hermetic sealed bag 108 may internally incorporate one or more of thermally-conductive fin structures 114 configured to enhance the heat transfer from the electronic assembly package 120 to the ambient cooled non-dielectric fluid 104. In related examples, the hermetic sealed bag 108 incorporates a heat managing substance that can collect thermal energy and/or increase a transfer of thermal energy from the electronic components 110 to the fluid 104. The heat managing substance may be for example and without limitation a heat-transfer fluid (e.g. a dielectric liquid), a Phase Change Material (PCM) such as a paraffin wax, or a combination thereof. In this example, a PCM capable of changing physical states based on temperature fluctuations is incorporated in the thermally-conductive fins 114 to further enhance the conductive heat transfer to the ambient cooled non-dielectric fluid 104. In examples where the cooled fluid 104 is a dielectric fluid, the hermetic sealed bag 108 provides corrosion protection that could be generated by the cooled fluid 104.

Moreover, in accordance with certain examples, liquid cooling blocks may be incorporated to be in close proximal contact to heat generating electronic components for thermal transfer. The liquid cooling blocks include internal fluid conduits that accommodate the flow of cooling water therethrough and may be deployed inside or outside the hermetic sealed bag 108. If the liquid cooling blocks are deployed within the hermetic sealed bag 108, the hermetic sealed bag 108 is configured to provide the air- and water-tight sealing around the fluid distribution facilities in addition to the power and communication cabling facilities 112.

In the examples set forth in the present disclosure, the hermetic sealed bag 108 is vacuum-sealed to hermetically encase the electronic components 110. However, it is contemplated that, the hermetic sealed bag 108 may be, once encasing the electronic components 110, glued and/or heated such that a shape of the hermetic sealed bag 108 substantially fits an external shape of the electronic components 110.

Figure 3:
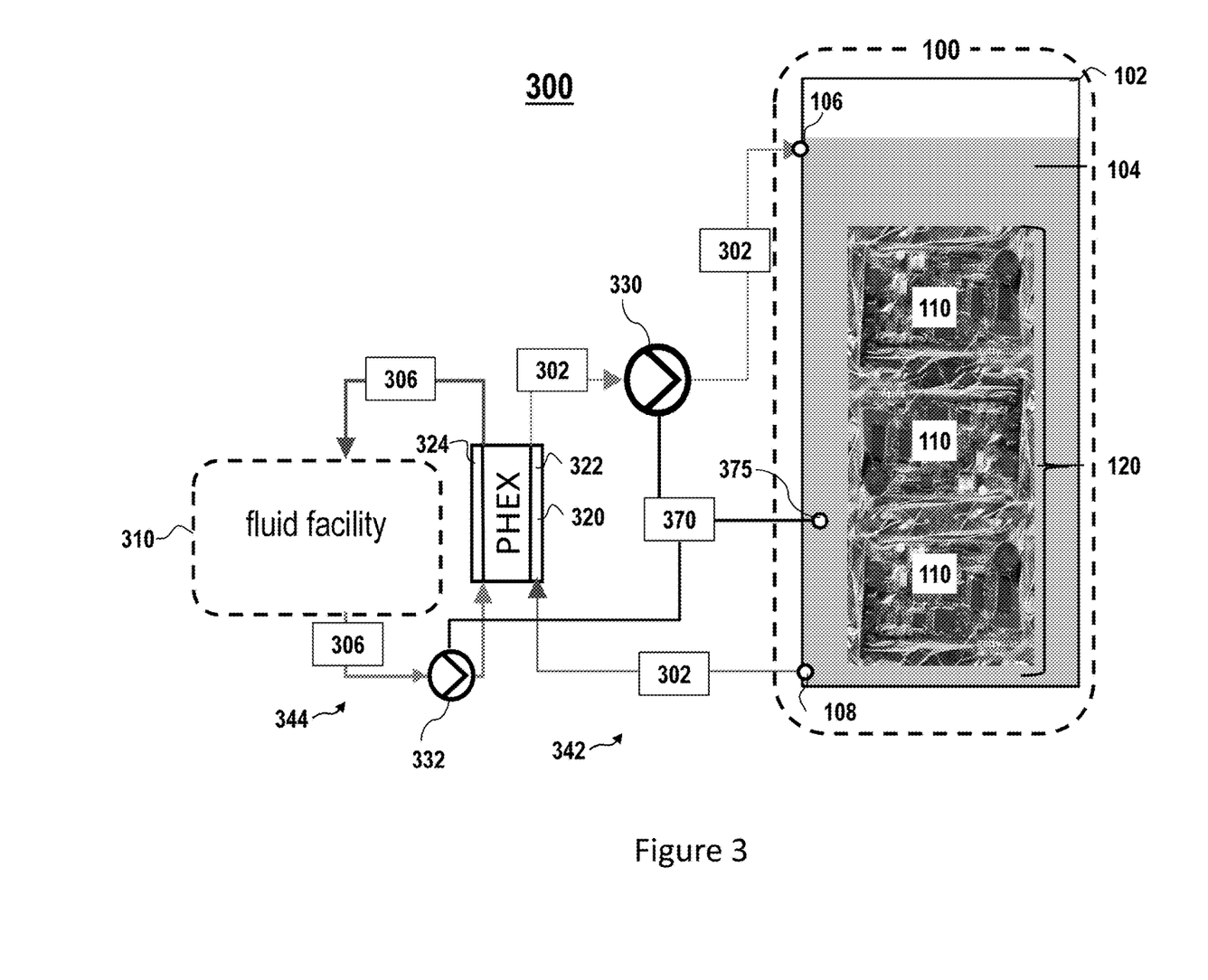
FIG. 3 depicts a functional block diagram of an operational implementation arrangement of the rack-mounted, fluid IC system, in accordance with examples of the present technology.

FIG. 3 depicts a functional block diagram of an operational implementation arrangement 300 of the rack-mounted, non-dielectric fluid (i.e., water-based) IC system, in accordance with the examples of the present disclosure. The implementation arrangement 300 incorporates the rack-mounted non-dielectric fluid-based IC system 100 described above, comprising the hermetic sealed electronic assembly package 120 submerged in the volume of thermally cooled non-dielectric fluid (i.e., water) 104 contained by the rack-mounted IC reservoir 102.

As shown, implementation arrangement 300 processes the supply of thermally cooled water 302 to the IC system 100 and the redirected warm water heated by the electronic components 110 from the IC system 100. In this example, the implementation arrangement 300 includes a first cooling loop 342 and a second cooling loop 344. A liquid-to-liquid heat exchanger 320, for example a plate heat exchanger (PHEX) is implemented to thermally connect the first and second cooling loops 342, 344. The first and second cooling loops 342, 344 include a first and a second pumps 330, 332 respectively for circulating fluids therein.

Within the first cooling loop 342, a first heat transfer fluid 302, which is water in this example, is conveyed to the rack-mounted water-based IC system 100 for cooling of the hermetic sealed electronic assembly package 120. More specifically, in this example, the rack-mounted IC reservoir 102 define a reservoir inlet 106 for receiving cold first heat transfer fluid 302. The first heat transfer fluid 302 further collects thermal energy of the hermetic sealed electronic assembly package 120 in the rack-mounted water-based IC system 100. More specifically, during operations, the electronic components 110 of sealed electronic assembly package 120 generate heat that is transferred to the non-dielectric fluid 104 (i.e. heat transfer fluid 302 that is currently located in the rack-mounted IC reservoir 102) contained by the rack-mounted IC reservoir 102. This may result in the generation of warm heat transfer fluid 302 within the rack-mounted IC reservoir 102 that is addressed by the first cooling loop 342. In this example, the rack-mounted IC reservoir 102 define a reservoir outlet 108 for exiting the warm heat transfer fluid 302.

In particular, the first cooling loop 342 functions to redirect the warm heat transfer fluid 302 from rack-mounted IC reservoir 102 to the liquid-to-liquid heat exchanger 320. The hot first heat transfer fluid 302 is further outputted from the rack-mounted IC reservoir 102 and directed to the liquid-to-liquid heat exchanger 320. More specifically, the hot first heat transfer fluid 302 is directed to a first side 322 of the liquid-to-liquid heat exchanger 320 and the thermal energy collected by the first heat transfer fluid 302 is transferred to the second cooling loop 344 within the liquid-to-liquid heat exchanger 320.

Within the second cooling loop 344, a second cooling fluid 306 (e.g. water) is provided by the external fluid facility 310. In use, cold second cooling fluid 306 is provided to a second side 324 of the liquid-to-liquid heat exchanger 320 such that, in use, the second cooling fluid 306 may collect thermal energy of the first heat transfer fluid 302. More specifically, the second side 324 is thermally coupled to the first side 322 for transfer of heat from the first side 322 to the second side 324 when a temperature of the first side 322 is higher than a temperature of the second side 324. Hot second cooling fluid 306 is further circulated back to the external fluid facility 310. The external fluid facility 310 may include, for example and without limitation, a heat exchanger such as a dry cooler to cool the hot second cooling fluid 306.

In some examples, the rates at which the first and second pumps 330, 332 are controlled to conduct the first and second heat-transfer fluids 302, 306 respectively may be based on the thermal monitoring of the temperature of the immersive water, on predetermined timing cycles, or other thermal control techniques. For example, the implementation arrangement 300 may include a controller 370 for controlling the first and second pumps 330, 332 (e.g. rotational speeds thereof). In some examples, the implementation arrangement 300 further includes a temperature sensor 375 communicably connected to the controller 370 and providing data including information about a temperature of the non-dielectric fluid 104. In some examples, the controller 370 controls the rotational speed of the first and/or second pumps 330, 332 based on data provided by the temperature sensor 375.

The implementation arrangement 300 may also include valves (e.g. solenoid valves) and level sensors (e.g. a pressure sensor or an ultrasonic sensor) for determining a level of the non-dielectric fluid in the IC reservoir 102, said valves and sensors being communicably connected to the controller 370. For example, a valve may be disposed in the first cooling loop 342 to fluidly connect the first cooling loop 342 to a makeup non-dielectric fluid source. For example, if determination is made by the controller 370, based on the level sensors that a level of the non-dielectric fluid 104 is below a predetermined level threshold, the controller 370 may open the valve to increase the level of the non-dielectric fluid 104 in the IC reservoir 102 and the first cooling loop 342. Additionally or alternatively, if determination is made by the controller 370, based on the temperature sensor 375 that a temperature of the non-dielectric fluid 104 is above a predetermined temperature threshold, the controller 370 may open the valve to decrease the temperature of the non-dielectric fluid 104 in the IC reservoir 102 and the first cooling loop 342 by adding cool non-dielectric fluid 104 from the makeup non-dielectric fluid source in the first cooling loop 342.

Figure 4:
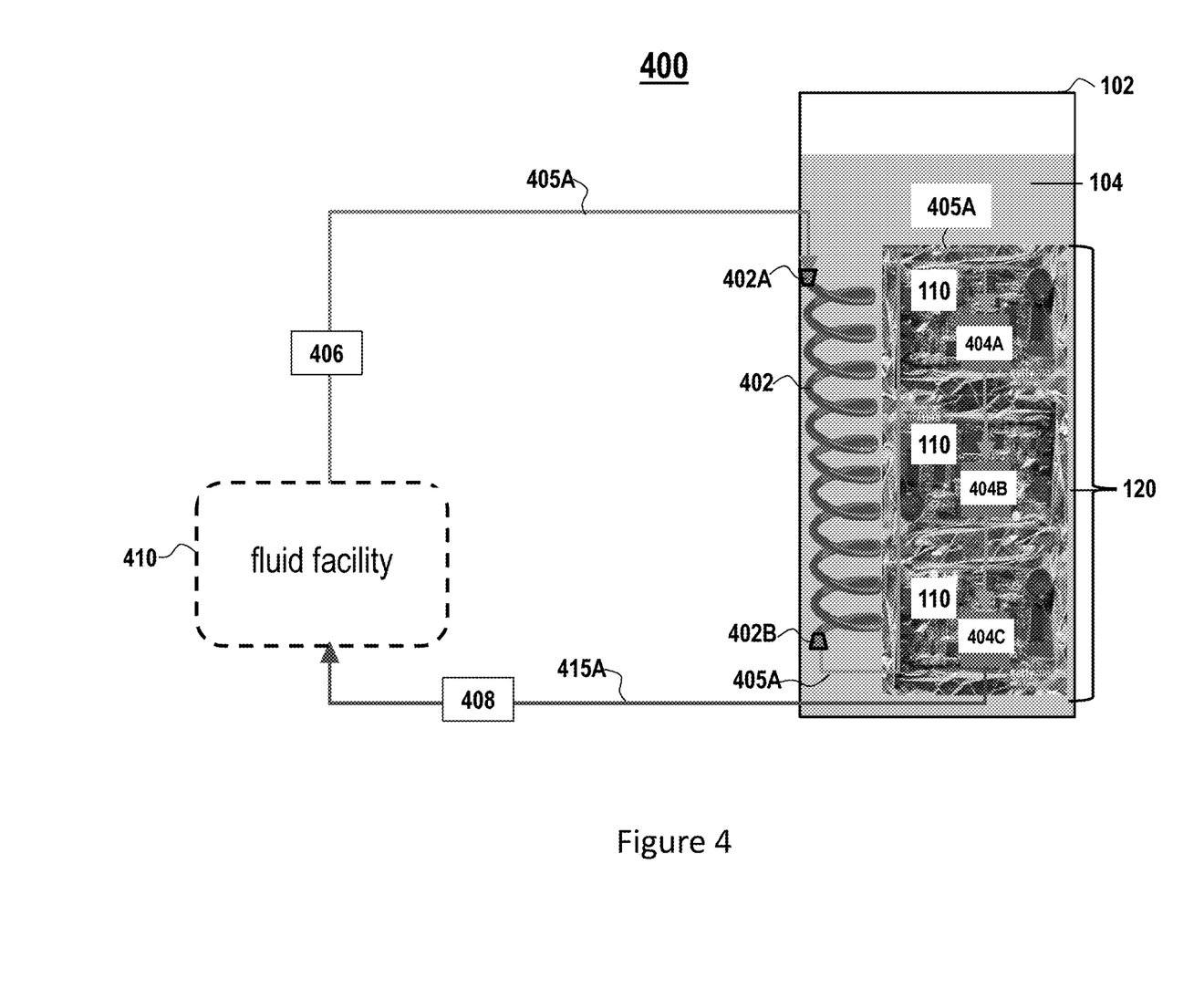
FIG. 4 depicts a functional block diagram of another operational implementation arrangement of the rack-mounted, fluid IC system, in accordance with examples of the present technology.

FIG. 4 depicts a functional block diagram of another operational implementation arrangement 400 of the rack-mounted, non-dielectric fluid (i.e., water-based) IC system, in accordance with the examples of the present disclosure. The implementation arrangement 400 incorporates the rack-mounted water-based IC system 100 described above, comprising the hermetic sealed electronic assembly package 120 submerged in the volume of thermally cooled non-dielectric fluid (i.e., water) 104 contained by the rack-mounted IC reservoir 102.

The implementation arrangement 400 also comprises a serpentine convection coil 402 that is submerged within the non-dielectric fluid (i.e., water) 104 contained by the rack-mounted IC reservoir 102. The serpentine convection coil 402 is structured with multiple hollow-channel coils configured to provide a high exposure surface area for maximizing thermal transfer as well as internally channeling cooling fluid (i.e., water) for cooling the non-dielectric fluid (i.e., water) 104 contained by the rack-mounted IC reservoir 102.

The implementation arrangement 400 further comprises liquid cooling blocks 404A-C imbedded within the hermetic sealed electronic assembly package 120. The liquid cooling blocks 404A-C are in fluid communication with each other by virtue of an internal conduit structure (not shown) that internally channels a channelized heat-transfer fluid through the blocks 404A-C. The liquid cooling blocks 404A-C are arranged to be in direct thermal contact with the one or more heat-generating electronic processing components 110 to provide additional cooling measures to such components via the internally channelized heat-transfer fluid. Said channelized heat-transfer fluid may be, for example and without limitation, water, oil, glycol or a combination thereof.

The fluid circulation infrastructure comprises a forward cooling fluid distribution circuit 405 incorporating cool channelized heat-transfer fluid 406 from external fluid facility 410, a forward closed-loop arrangement 405A configured to convey the distribution of the cool channelized heat-transfer fluid 406 from the fluid facility 410, the serpentine convection coil 402, and liquid cooling blocks 404A-C.

The fluid circulation infrastructure further comprises a return warm fluid distribution circuit 415 incorporating a return closed-loop arrangement 415A configured to convey the distribution of warm channelized heat-transfer fluid 408 from the liquid cooling blocks 404A-C back to the external fluid facility 310. The external fluid facility 310 may include a heat-exchanger (e.g. a dry cooler) for discharging thermal energy from the warm channelized heat-transfer fluid 408 and to provide cool channelized heat-transfer fluid 406.

It will be appreciated that the forward closed-loop arrangement 405A and return closed-loop arrangement 415A may comprise any suitable piping, tubing, conduit, or other sealed conveyance structures capable of transferring and distributing fluids. The arrangements 405A, 415A may consist of metal, rubber, or plastic materials, or any combination thereof.

Regarding the forward cooling fluid distribution circuit 405, cool channelized heat-transfer fluid 406 from the external fluid facility 410 is supplied, via the forward closed-loop arrangement 405A, to a fluidly-coupled input side 402A of the serpentine convection coil 402. The serpentine convection coil 110 functions to internally channel the forwarded cool channelized heat-transfer fluid 406 to provide thermal cooling of the non-dielectric 104 contained by the rack-mounted IC reservoir 102.

At a fluidly-coupled output side 402B of the serpentine convection coil 402, the channelized heat-transfer fluid is then forwarded, via the forward closed-loop arrangement 405A, to the liquid cooling blocks 404A-C, such that the channelized heat-transfer fluid flows within each of the liquid cooling blocks 404A-C in successive fashion, the liquid cooling blocks 404A-C being fluidly connected in series. In alternative examples, the liquid cooling blocks 404A-C may be fluidly connected in parallel with one another, such that the channelized heat-transfer fluid flows within each of the liquid cooling blocks 404A-C in a parallel manner. Although in FIG. 4 the channelized heat-transfer fluid flows in the serpentine convection coil 402 first, and then in the liquid cooling blocks 404A-C, it is contemplated that, in alternative examples, the channelized heat-transfer fluid may be directed in the liquid cooling blocks 404A-C before being directed to the serpentine convection coil 402. In other words, the serpentine convection coil 402 may be downstream the liquid cooling blocks 404A-C with respect to the flow of the cool channelized heat-transfer fluid provided by the external fluid facility 410.

During operations, the electronic components 110 of sealed electronic assembly package 120 generate heat. This may result in the heating of the channelized heat-transfer fluid within the liquid cooling blocks 404A-C. That is, the channelized heat-transfer fluid may become progressively warmer as it successively flows through the heat generating electronic components 110 associated with each of the liquid cooling blocks 404A-C.

Accordingly, the return warm fluid distribution circuit 415 is configured to return, via the return closed-loop arrangement 415A, the hot channelized heat-transfer fluid 408 from the final liquid cooling block (e.g., 404C), back to the external fluid facility 410.

Figure 5:
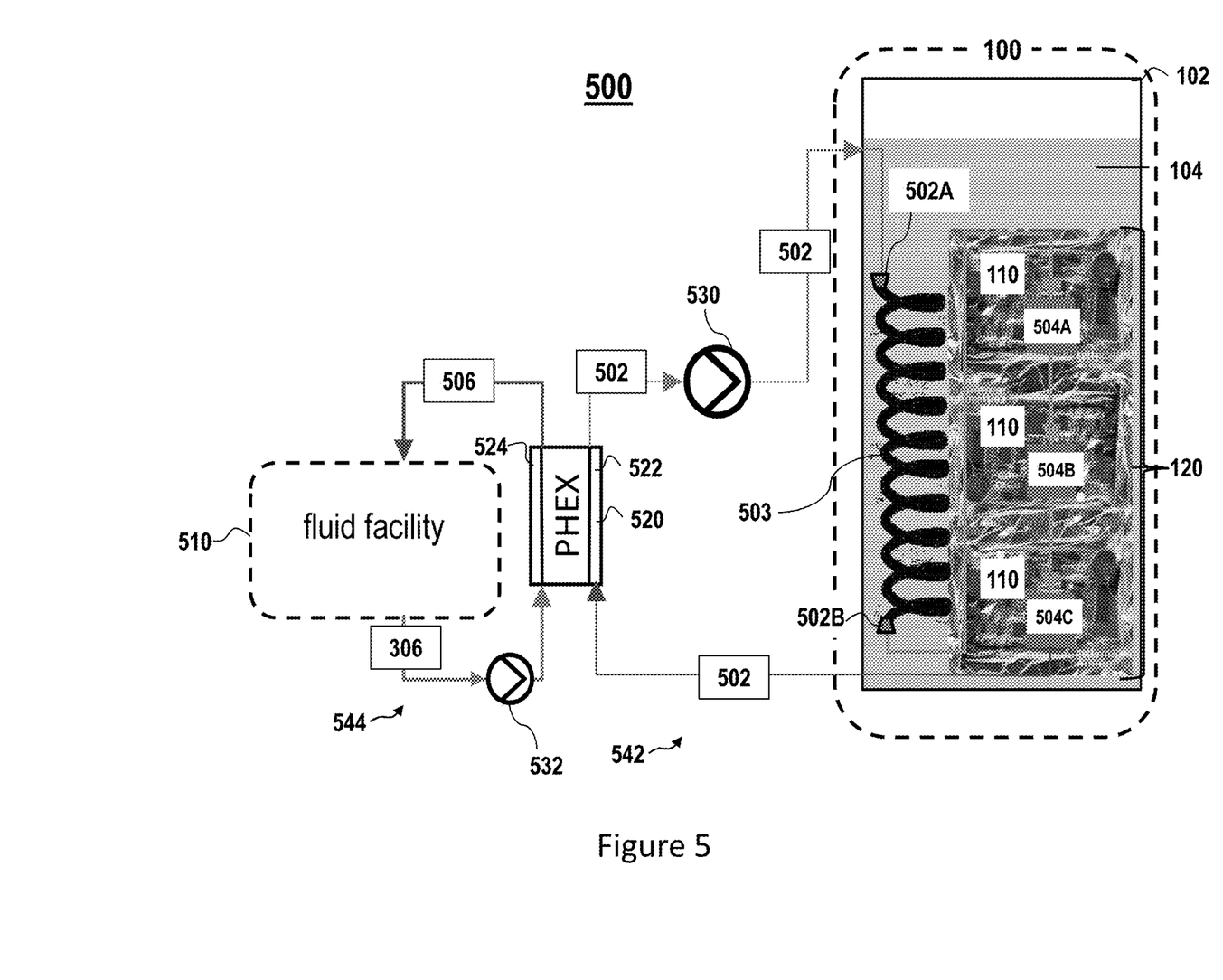
FIG. 5 depicts a functional block diagram of yet another operational implementation arrangement of the rack-mounted, fluid IC system, in accordance with examples of the present technology.

FIG. 5 depicts a functional block diagram of another operational implementation arrangement 500 of the rack-mounted, non-dielectric fluid (i.e., water-based) IC system, in accordance with the examples of the present disclosure. The implementation arrangement 500 incorporates the rack-mounted water-based IC system 100 described above, comprising the hermetic sealed electronic assembly package 120 submerged in the volume of thermally cooled non-dielectric fluid (i.e., water) 104 contained by the rack-mounted IC reservoir 102.

In this example, the implementation arrangement 500 includes a first cooling loop 542 and a second cooling loop 544. A liquid-to-liquid heat exchanger 520, for example a plate heat exchanger (PHEX) is implemented to thermally connect the first and second cooling loops 542, 544. The first and second cooling loops 542, 544 include a first and a second pumps 530, 532 respectively for circulating fluids therein. More specifically, a first heat-transfer fluid 502 flows within the first cooling loop 542 and a second heat-transfer fluid 506 flows within the second cooling loop 544. The first and second heat-transfer fluids 502, 506 may be a same or different non-dielectric liquids or dielectric fluids, such as water, glycol, oil or a combination thereof.

The first cooling loop 342 includes a serpentine convection coil 503 that is submerged within the non-dielectric fluid (i.e., water) 104 contained by the rack-mounted IC reservoir 102. The serpentine convection coil 503 receives cold first heat-transfer fluid 502 from a first side 522 of the liquid-to-liquid heat exchanger 520. The serpentine convection coil 503 is structured with multiple hollow-channel coils configured to provide a high exposure surface area for maximizing thermal transfer as well as internally channeling cooling fluid 502 for cooling the non-dielectric fluid (i.e., water) 104 contained by the rack-mounted IC reservoir 102.

The first cooling loop 342 further includes liquid cooling blocks 504A-C imbedded within the hermetic sealed electronic assembly package 120. The liquid cooling blocks 504A-C are in fluid communication with each other by virtue of an internal conduit structure (not shown) that internally channels the first heat-transfer fluid 502 through the blocks 504A-C. The liquid cooling blocks 504A-C are arranged to be in direct thermal contact with the one or more heat-generating electronic processing components 110 to provide additional cooling measures to such components via the internally channelized first heat-transfer fluid 502.

During operations, the electronic components 110 of sealed electronic assembly package 120 generate thermal energy. This may result in the heating of the first heat-transfer fluid 502 within the liquid cooling blocks 404A-C. That is, the first heat-transfer fluid 502 may become progressively warmer as it successively flows through the heat generating electronic components 110 associated with each of the liquid cooling blocks 504A-C. In this example, the first heat-transfer fluid 502 flows within each of the liquid cooling blocks 504A-C in successive fashion, the liquid cooling blocks 504A-C being fluidly connected in series. In alternative examples, the liquid cooling blocks 504A-C may be fluidly connected in parallel with one another, such that the first heat-transfer fluid 502 flows within each of the liquid cooling blocks 404A-C in a parallel manner.

Once the first heat-transfer fluid 502 has collected thermal energy of the heat-generating electronic processing components 110 and exits the liquid cooling blocks 504A-C, the first heat-transfer fluid 502 is conveyed to the first side 522 of the liquid-to-liquid heat exchanger 520. It will be appreciated that the first cooling loop 342 may comprise any suitable piping, tubing, conduit, or other sealed conveyance structures capable of transferring and distributing fluids.

Although in FIG. 5 the first heat-transfer fluid 502 flows in the serpentine convection coil 503 first, and then in the liquid cooling blocks 504A-C, it is contemplated that, in alternative examples, the first heat-transfer fluid 502 may be directed in the liquid cooling blocks 504A-C before being directed to the serpentine convection coil 503. In other words, the serpentine convection coil 503 may be downstream the liquid cooling blocks 504A-C with respect to the flow of the cool first heat-transfer fluid 502 provided by first side 522 of the liquid-to-liquid heat exchanger 520.

Within the second cooling loop 544, the second heat-transfer fluid 506 is provided by the external fluid facility 510. In use, cold second heat-transfer fluid 506 is provided to a second side 524 of the liquid-to-liquid heat exchanger 520 such that, in use, the second heat-transfer fluid 506 may collect thermal energy of the first heat-transfer fluid 502. More specifically, the second side 524 is thermally coupled to the first side 522 for transfer of heat from the first side 522 to the second side 524 when a temperature of the first side 522 is higher than a temperature of the second side 524. Hot second heat-transfer fluid 506 is further circulated back to the external fluid facility 510. The external fluid facility 510 may include, for example and without limitation, a heat exchanger such as a dry cooler to cool the hot second cooling fluid 506.

In some examples, the rates at which the first and second pumps 530, 532 are controlled to conduct the first and second heat-transfer fluids 502, 506 respectively may be based on the thermal monitoring of the temperature of the immersive non-dielectric fluid 104, on predetermined timing cycles, or other thermal control techniques. For example, the implementation arrangement 500 may include a controller (e.g. such as the controller 370) for controlling the first and second pumps 530, 532 (e.g. rotational speeds thereof). In some examples, the implementation arrangement 500 further includes a temperature sensor (e.g. such as the temperature sensor 375) communicably connected to the controller and providing data including information about a temperature of the non-dielectric fluid 104. In some examples, the controller controls the rotational speed of the first and/or second pumps 530, 532 based on data provided by the temperature sensor.

In view of the various disclosures directed to non-dielectric IC systems implementing submerged hermetically sealed electronic assembly packages, it will be understood that, although the examples presented herein have been described with reference to specific features and structures, it is clear that various modifications and combinations may be made without departing from such disclosures. The specification and drawings are, accordingly, to be regarded simply as an illustration of the discussed implementations or examples and their principles as defined by the appended claims, and are contemplated to cover any and all modifications, variations, combinations or equivalents that fall within the scope of the present disclosure.

What is claimed is:

1. A rack-mounted fluid immersion cooling (IC) system, comprising:

a rack-mounted immersion reservoir containing a volume of thermally cooled fluid;

at least one hermetic sealed electronic assembly package comprising one or more electronic processing components, the at least one hermetic sealed electronic assembly package being encased within a hermetic sealed bag configured to provide a seal of the at least one hermetic sealed electronic assembly package to protect against direct fluid exposure by the corresponding one or more electronic processing components and around power and communication cabling facilities and liquid cooling distribution facilities that service the electronic processing components, the at least one hermetic sealed electronic assembly package being submerged within the volume of thermally cooled fluid contained by the rack-mounted immersion reservoir;

a forward cooling fluid distribution circuit configured to distribute a channelized heat-transfer fluid;

a serpentine convection coil submerged within the thermally cooled fluid contained by the rack-mounted IC reservoir, the serpentine convection coil structured with multiple hollow-channel coils to receive and internally convey the channelized heat-transfer fluid distributed by the forward cooling fluid distribution circuit;

at least one liquid cooling block arranged to be in direct thermal contact with the one or more electronic processing components of the submerged hermetic sealed electronic processing assembly, the at least one liquid cooling block including an internal conduit structure fluidly connected to the serpentine convection coil to receive the channelized heat-transfer fluid and configured to internally convey the received channelized heat-transfer fluid therethrough; and a return warm fluid distribution circuit configured to receive warmed channelized heat-transfer fluid heated by the heat-generating one or more electronic components for re-cooling and recirculation of the re-cooled channelized heat-transfer fluid.

2. The rack-mounted, fluid IC system of claim 1, wherein thermally cooled fluid is a thermally cooled non-dielectric fluid.

3. The rack-mounted, fluid IC system of claim 2, wherein the thermally cooled non-dielectric fluid comprises water.

4. The rack-mounted, fluid IC system of claim 1, wherein the hermetic sealed bag is configured to provide a liquid- and air-tight seal of the at least one hermetic sealed electronic assembly package and the power and communication cabling facilities and liquid cooling distribution facilities that service the electronic processing components.

5. The rack-mounted, fluid IC system of claim 1, wherein the hermetic sealed bag comprises a film material formed by a material selected from a group of materials, said group comprising: polyamide compounds, polyethylene compounds and combinations thereof.

6. The rack-mounted, fluid IC system of claim 1, wherein the hermetic sealed bag comprises a film material manifesting low thermal resistance properties while having heat protective properties.

7. The rack-mounted, fluid IC system of claim 1, wherein the hermetic sealed bag internally incorporates one or more thermally-conductive fin structures configured to enhance heat transfer from the hermetic sealed electronic assembly package to the thermally cooled fluid.

8. The rack-mounted, fluid IC system of claim 1, wherein the hermetic sealed bag incorporates a phase-changing material (PCM) substance for controlling heat transfers provided therein.

9. The rack-mounted, fluid IC system of claim 1, further comprising:
a first cooling loop configured to circulate a first heat transfer fluid, the first cooling loop comprising:
the rack-mounted immersion reservoir containing the submerged hermetic sealed electronic processing package;
a first pump configured to forcibly supply the first heat transfer fluid in the first cooling loop; and
a first side of a liquid-to-liquid heat exchanger, the first side being fluidly connected to the rack-mounted immersion reservoir,
a second cooling loop configured to circulate a second heat transfer fluid, the second cooling loop comprising:
a fluid facility for providing a cold second heat transfer fluid;
a second side of the liquid-to-liquid heat exchanger, the second side being thermally coupled to the first side for transfer of heat from the first side to the second side when a temperature of the first side is higher than a temperature of the second side; and
a second pump configured to forcibly supply the second heat transfer fluid to the rack-mounted immersion reservoir.

10. The rack-mounted, fluid IC system of claim 9, wherein the liquid-to-liquid heat exchanger comprises a plate heat exchanger (PHEX).

11. The rack-mounted, fluid IC system of claim 1, wherein the at least one liquid cooling block comprises a plurality of liquid cooling blocks configured in a serial fluid communication arrangement to facilitate the successive transfer of channeled heat-transfer fluid.

12. A method for fluid immersion cooling (IC) of at least one hermetic sealed electronic assembly package containing one or more electronic processing components, comprising:
providing a volume of thermally cooled fluid to a rack-mounted immersion reservoir;
encasing the at least one hermetic sealed electronic assembly package within a hermetic sealed bag that provides a liquid- and air-tight seal to shield against direct fluid exposure by the one or more electronic processing components, the at least one hermetic sealed electronic assembly package being submerged within the volume of thermally cooled fluid contained by the rack-mounted immersion reservoir;
providing a forward cooling fluid distribution circuit configured to distribute a channelized heat-transfer fluid;
installing a serpentine convection coil submerged within the thermally cooled fluid contained by the rack-mounted IC reservoir, the serpentine convection coil structured with multiple hollow-channel coils to receive and internally convey the channelized heat-transfer fluid distributed by the forward cooling fluid distribution circuit;
incorporating at least one liquid cooling block arranged to be in direct thermal contact with the one or more electronic processing components of the submerged hermetic sealed electronic processing assembly, the at least one liquid cooling block including an internal conduit structure fluidly connected to the serpentine convection coil to receive the channelized heat-transfer fluid and configured to internally convey the received channelized heat-transfer fluid therethrough; and
providing a return warm fluid distribution circuit configured to receive warmed channelized heat-transfer fluid heated by the heat-generating one or more electronic components for re-cooling and recirculation of the re-cooled channelized heat-transfer fluid.

13. The method for fluid IC of claim 12, wherein the thermally cooled fluid comprises water.

* * * * *